(12) United States Patent
Lin et al.

(10) Patent No.: US 8,488,086 B2
(45) Date of Patent: Jul. 16, 2013

(54) LIGHT REFLECTING STRUCTURE IN A LIQUID CRYSTAL DISPLAY PANEL

(75) Inventors: Hsiang-Lin Lin, Hsinchu (TW); Chun-Chieh Tsao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 64 days.

(21) Appl. No.: 13/136,511

(22) Filed: Aug. 2, 2011

(65) Prior Publication Data

US 2011/0292327 A1 Dec. 1, 2011

Related U.S. Application Data

(62) Division of application No. 11/707,577, filed on Feb. 15, 2007, now Pat. No. 8,059,236.

(51) Int. Cl.
*G02F 1/1335* (2006.01)

(52) U.S. Cl.
USPC .......... 349/113; 349/114; 349/110; 428/1.52; 430/5

(58) Field of Classification Search
USPC ......................................... 349/113, 114, 110
See application file for complete search history.

(56) References Cited

U.S. PATENT DOCUMENTS

| | | | |
|---|---|---|---|
| 5,867,233 A * | 2/1999 | Tanaka | 349/43 |
| 6,653,178 B2 | 11/2003 | Tsujimura et al. | 438/158 |
| 6,822,708 B2 | 11/2004 | Fujino | 349/113 |
| 6,862,056 B2 * | 3/2005 | Yamaguchi et al. | 349/113 |
| 7,206,045 B2 | 4/2007 | Jang et al. | 349/113 |
| 7,514,303 B2 | 4/2009 | Yamaguchi et al. | 438/151 |
| 2004/0174481 A1 | 9/2004 | Lin et al. | 349/129 |
| 2006/0152644 A1* | 7/2006 | Yi | 349/42 |
| 2006/0170845 A1* | 8/2006 | Lee | 349/114 |
| 2007/0258027 A1* | 11/2007 | Maeda et al. | 349/113 |
| 2009/0262284 A1* | 10/2009 | Hamilton | 349/106 |
| 2010/0055850 A1 | 3/2010 | Chiang et al. | 438/155 |

FOREIGN PATENT DOCUMENTS

| | | | |
|---|---|---|---|
| CN | 1384390 | * | 5/2001 |
| CN | 1384390 | * | 12/2002 |
| CN | 1384390 A | | 12/2002 |
| JP | 2003-315788 | | 4/2002 |
| JP | 2003-315788 | * | 11/2003 |

* cited by examiner

Primary Examiner — Edward Glick
Assistant Examiner — Sang V Nguyen (57) ABSTRACT

A method for producing a light reflecting structure in a transflective or reflective liquid crystal display uses one or two masks for masking a photoresist layer in a back-side exposing process. The pattern on the masks is designed to produce rod-like structures or crevices and holes on exposed and developed photoresist layer. After the exposed photoresist is developed, a heat treatment process or a UV curing process is used to soften the photoresist layer so that the reshaped surface is more or less contiguous but uneven. A reflective coating is then deposited on the uneven surface. One or more intermediate layers can be made between the masks, between the lower mask and the substrate, and between the upper masks and the photoresist layers. The masks and the intermediate layers can be made in conjunction with the fabrication of the liquid crystal display panel.

16 Claims, 10 Drawing Sheets

LIGHT REFLECTING STRUCTURE IN A LIQUID CRYSTAL DISPLAY PANEL

CROSS REFERENCE TO RELATED APPLICATION

This application is a divisional application of and claims benefit of U.S. patent application Ser. No. 11/707,577, filed Feb. 15, 2007, which is now issued as U.S. Pat. No. 8,059,236.

FIELD OF THE INVENTION

The present invention relates generally to a liquid crystal display panel and, more particularly, to a reflective or transflective liquid crystal display panel.

BACKGROUND OF THE INVENTION

Due to the characteristics of thin profile and low power consumption, liquid crystal displays (LCDs) are widely used in electronic products, such as portable personal computers, digital cameras, projectors, and the like. Generally, LCD panels are classified into transmissive, reflective, and transflective types. A transmissive LCD panel uses a back-light module as its light source. A reflective LCD panel uses ambient light as its light source. A transflective LCD panel makes use of both the back-light source and ambient light.

Figure 1:
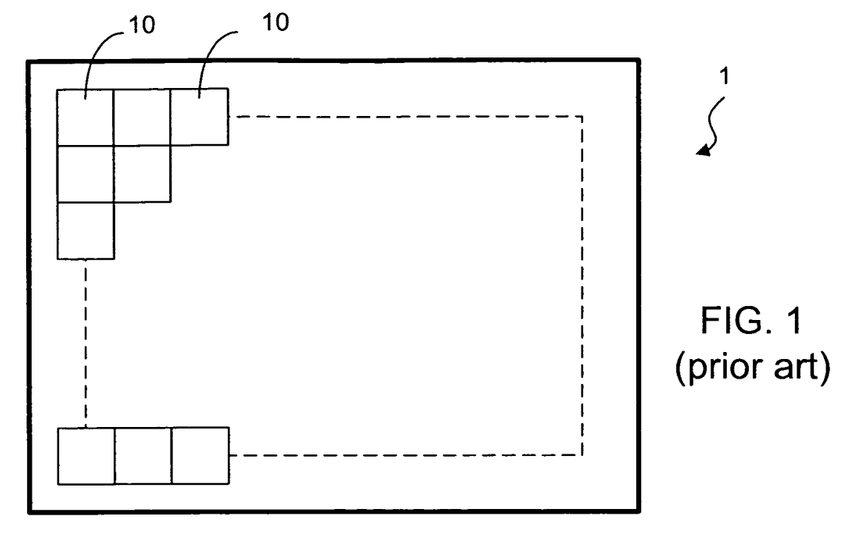
FIG. 1 is a schematic representation showing a typical LCD display.
Figure 2:
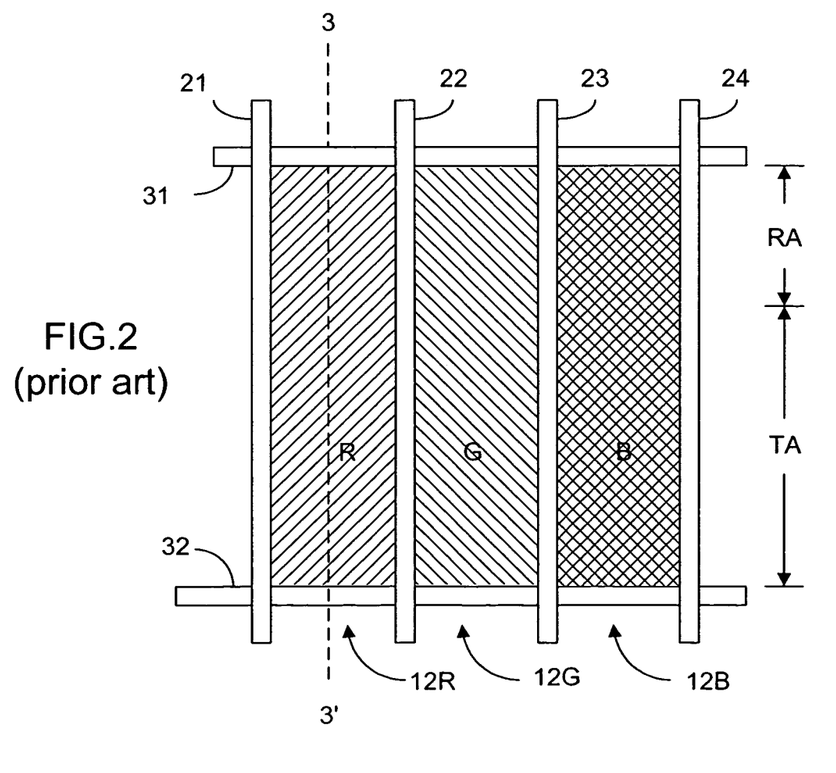
FIG. 2 is a plane view showing the pixel structure of a conventional transflective color LCD display.
Figure 3A:
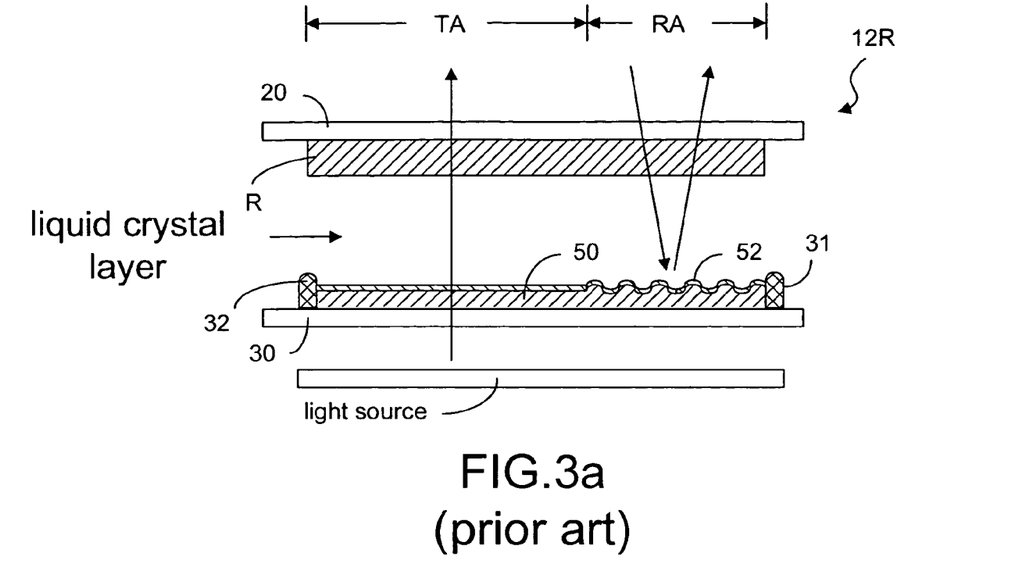
FIG. 3a is a cross sectional view showing the reflection and transmission of light beams in the pixel as shown in FIG. 2.
Figure 3B:
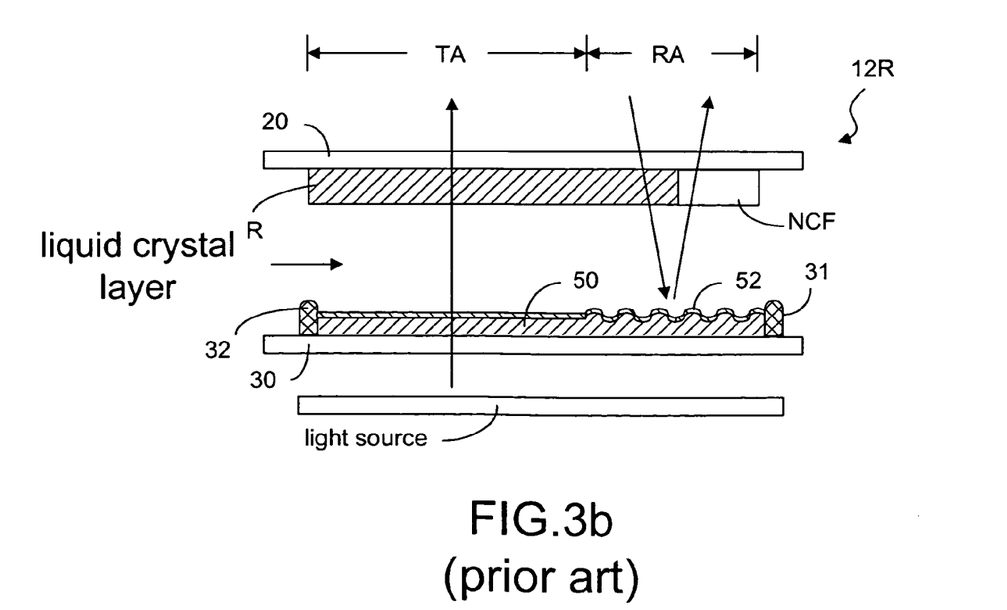
FIG. 3b is a cross sectional view showing the reflection and transmission of light beams in another prior art transflective display.

As known in the art, a color LCD panel 1 has a two-dimensional array of pixels 10, as shown in FIG. 1. Each of the pixels comprises a plurality of sub-pixels, usually in three primary colors of red (R), green (G) and blue (B). These RGB color components can be achieved by using respective color filters. FIG. 2 illustrates a plan view of the pixel structure in a conventional transflective liquid crystal panel, and FIG. 3 is a cross sectional view of the pixel structure. As shown in FIG. 2, a pixel can be divided into three sub-pixels 12R, 12G and 12B and each sub-pixel can be divided into a transmission area (TA) and a reflection area (RA). In the transmission area as shown in FIG. 3a, light from a back-light source enters the pixel area through a lower substrate 30, and goes through a liquid crystal layer, a color filter R and the upper substrate 20. In the reflection area, light encountering the reflection area goes through an upper substrate 20, the color filter R and the liquid crystal layer before it is reflected by a reflective layer 52. Alternatively, part of the reflection area is covered by a non-color filter (NCF), as shown in FIG. 3b.

As known in the art, there are many more layers in each pixel for controlling the optical behavior of the liquid crystal layer. These layers may include a device layer 50 and one or two electrode layers. The device layer is typically disposed on the lower substrate and comprises gate lines 31, 32, data lines 21-24 (FIG. 2), transistors, and passivation layers (not shown).

It is advantageous and desirable to provide a method for making the reflective layer in a transflective or reflective liquid crystal display panel.

SUMMARY OF THE INVENTION

The present invention provides a method for producing a light reflecting structure for use in the pixels of a transflective or reflective liquid crystal display. One or two masks are disposed on a substrate for producing an uneven surface pattern in a photoresist layer disposed on the mask when the photoresist layer is exposed by a light beam through the mask and developed. The exposed and developed photoresist layer is softened in a heat treatment process or a UV curing process to produce a reshaped surface. A reflective coating is disposed on the reshaped surface. In particular, when two masks are used for partially blocking the light beam in the exposure process, both masks have light-blocking areas and non-blocking areas. These areas are arranged such that the combined non-blocking areas are smaller than the non-blocking areas in either one of the masks. The masks are designed such that at least part of the uneven surface comprises rod-like bumps. These bumps are partially joined when the photoresist layer is softened in the reshaping process. The masks can also be designed such that at least part of the uneven surface comprises crevices or holes. These crevices or holes are partially filled when the photoresist layer is softened in the reshaping process. The light reflecting structure may have one or more intermediate layers disposed between the masks, between the photoresist layer and the upper mask, and between the substrate and the lower mask.

Thus, the first aspect of the present invention is a method for producing a light reflective structure on a substrate in a liquid crystal display panel. The method comprises the steps of:

providing a mask on the substrate, the mask having light-blocking areas and non-light blocking areas;

disposing a photoresist layer on the mask;

exposing the photoresist layer through the mask for providing an exposed photoresist layer having exposed layer areas;

developing the exposed photoresist layer for producing an uneven surface;

reshaping the uneven surface for producing a reshaped surface; and disposing a light reflective coating on the reshaped surface, wherein the reshaping step can be a heating process or a UV curing process for softening the photoresist layer.

Advantageously, the method further comprises the step of disposing one or more intermediate layers between the substrate and the mask, and/or disposing one or more intermediate layers between the photoresist layer and the mask.

Advantageously, the method also comprises the step of providing a further mask between the intermediate layers and the photoresist layer, wherein the further mask has light-blocking areas at least partially different from the light-blocking areas in the mask so as to reduce the exposed layer areas.

Advantageously, the method further comprises the step of disposing one or more different intermediate layers between the photoresist layer and the further mask.

The second aspect of the present invention is a light reflecting structure in a pixel in a liquid crystal display having a substrate. The light reflecting structure comprises:

a first mask disposed on the substrate, the first mask having light-blocking areas and non-light blocking areas;

one or more intermediate layers disposed on the first mask;

a second mask disposed on the intermediate layers, wherein the second mask has further light blocking areas and further non-light blocking areas;

a photoresist layer disposed on the second mask; wherein the further light-blocking areas are at least partially different from the light blocking areas and the further non-light blocking areas are partially overlapped with the non-light blocking areas so as to allow a light beam to expose at least part of the photoresist layer through the first and second masks in an exposing process; and a reflective coating disposed on the photoresist layer.

Advantageous, the masks and the intermediate layers are some of the layers for producing the gate lines, the common electrodes and the transistors in the liquid crystal display. For example, each of the first and second masks is made of a metal layer, one or more of the intermediate layers comprises a dielectric layer, an amorphous silicon layer or a passivation layer.

The third aspect of the present invention is a liquid crystal display panel comprising two substrates and a liquid crystal layer between the substrates to form a plurality of pixels, wherein at least some pixels comprise the light reflecting structure as described above. The liquid crystal display panel can be a reflective LCD panel or a transflective LCD panel.

The present invention will become apparent upon reading the description taken in conjunction with FIGS. 4a to 13.

DETAILED DESCRIPTION OF THE INVENTION

Figure 4:
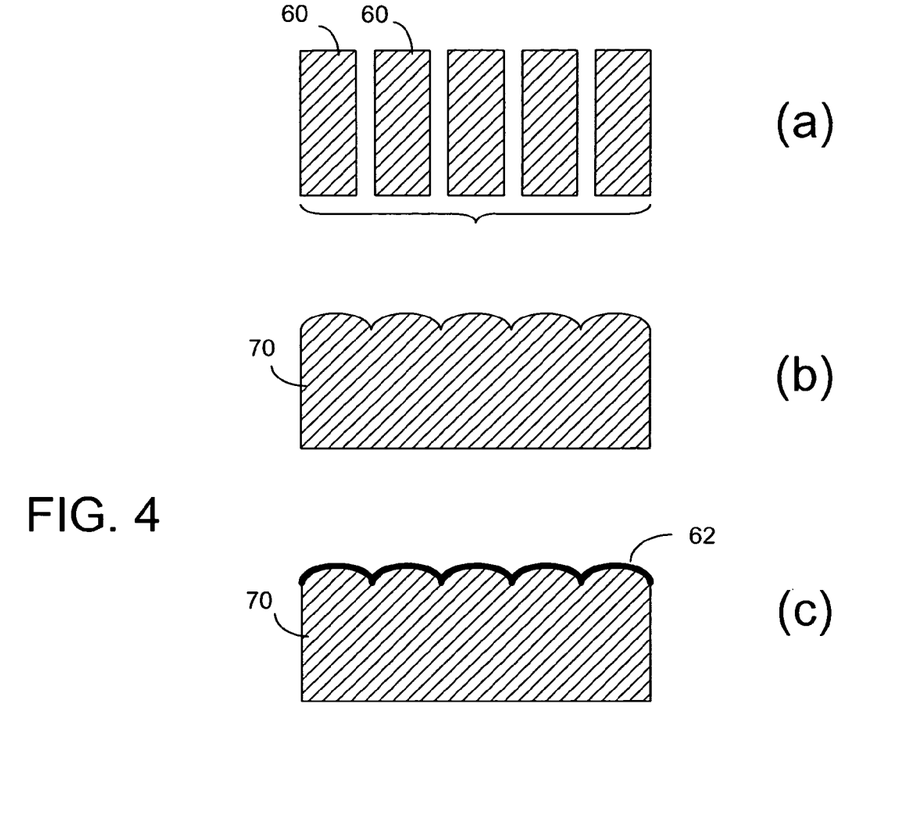
FIGS. 4a to 4c illustrate the general method of producing a reflective layer, according to the present invention.

It is generally preferred that the reflective layer in the reflection area in a transflective or reflective liquid crystal display (LCD) panel has an uneven surface such as the reflective layer 52 shown in FIGS. 3a and 3b. The present invention provides a method in making such a reflective layer. As shown in FIG. 4a, the reflective layer is formed from a plurality of discrete bumps, or rod-like objects 60. The rod-like objects are partially softened in a re-flow process so that they join with each other to become a single layer 70 having a wavy surface as shown in FIG. 4b. The surface is then coated with a reflective material to form a reflective layer 62, as shown in FIG. 4c. In order to form the single layer 70, the rod-like objects 60 must behave like a viscid fluid during the re-flow process and become solidified after the process. Furthermore, the rod-like objects should be simple to make. According to the present invention, the rod-like objects 60 are made of a photoresist material which can be softened in a heat treatment process or a UV curing process. After the single layer 70 has been formed, a layer of metal such as Al or Ag is coated to form the reflective layer 62.

Figure 5:
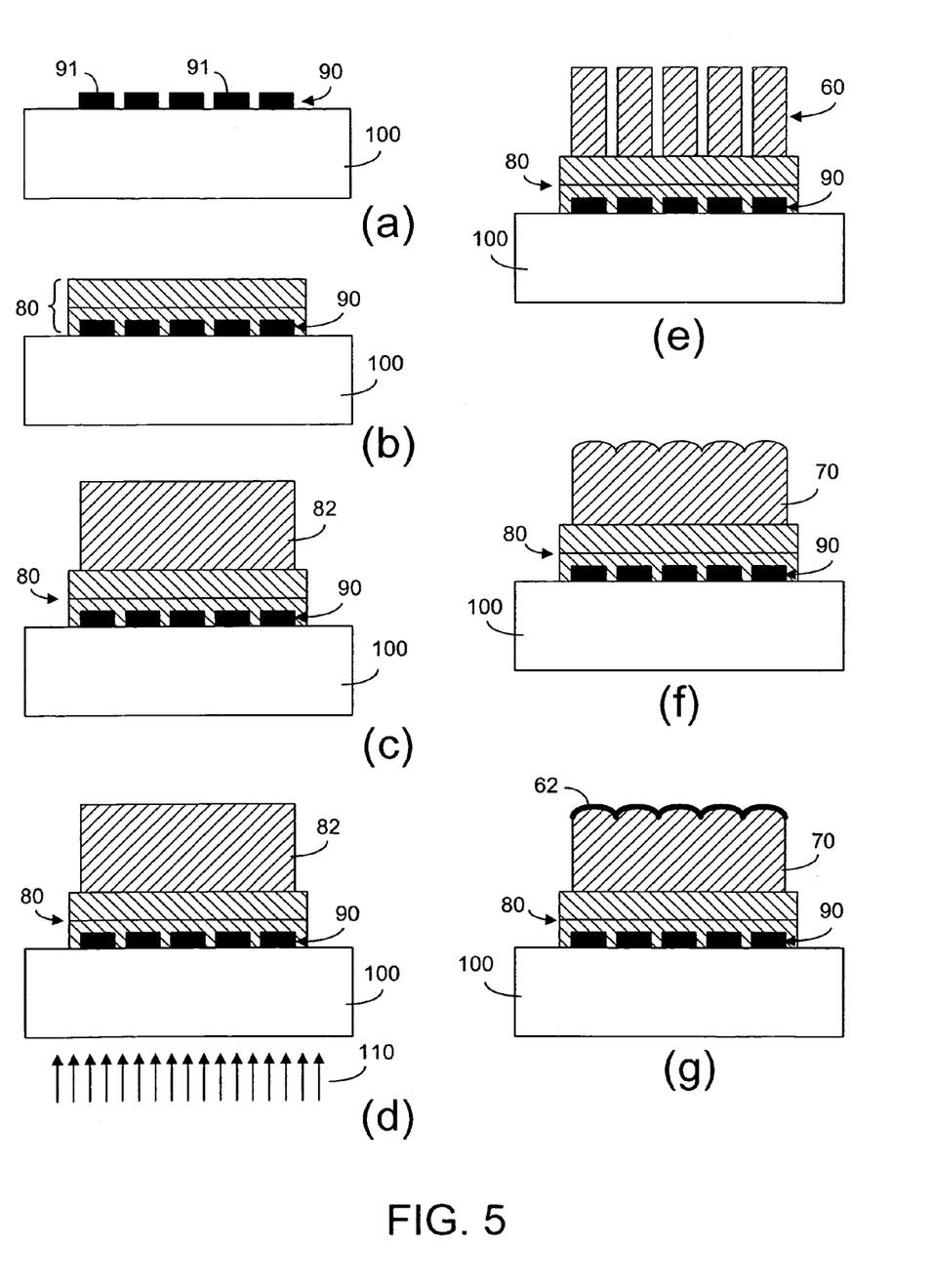
FIGS. 5a to 5g illustrate the steps in making the reflective layer on a substrate, according to one embodiment of the present invention.

In one embodiment of the present invention, the rod-like objects 60 are fabricated in a number of photolithography and etching processes (PEPs) on a substantially transparent substrate. As shown in FIG. 5a; a mask 90 is produced on a substrate 100. The mask 90 has opaque areas 91 to partially block a light beam 100 in a backside exposure process (FIG. 5d). In an optional step, one or more intermediate layers 80 are disposed on top of the mask 90, as shown in FIG. 5b. A layer of photoresist 82, such as a positive-type photoresist material, is provided on top of the optional layers 80, as shown in FIG. 5c. A backside exposure procedure using a light beam 110 is carried out as shown in FIG. 5d. As part of the light beam is allowed to transmit through the intermediate layers 80 and the non-blocking areas on the mask 90, it interacts with part of the photoresist layer. After the partially exposed photoresist layer is developed, the exposed part is removed and the remaining photoresist layer has a plurality of discrete bumps or rod-like objects 60, as shown in FIG. 5e. The rod-like objects are softened so that they join each other to form a single layer 70, as shown in FIG. 5f. Depending on the photoresist material, the rod-like objects 60 can be softened in a heat treatment process or a UV curing process, for example. The surface of the single layer 70 is then coated with a reflective layer 62, as shown in FIG. 5g.

Figure 6:
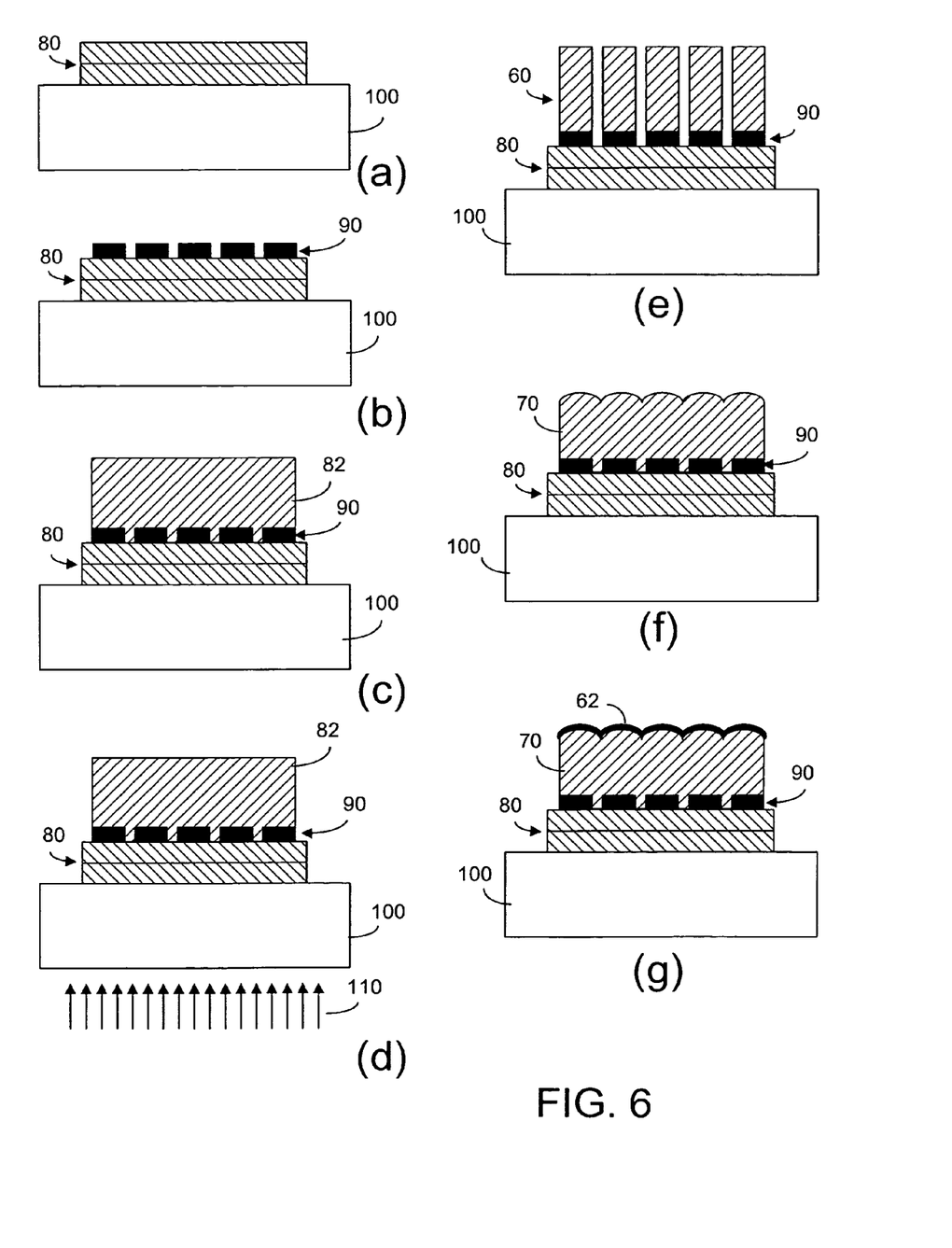
FIGS. 6a to 6g illustrate the steps in making the reflective layer on a substrate, according to another embodiment of the present invention.

FIGS. 6a to 6g show another embodiment of the present invention in which the order of disposing the mask 90 and the intermediate layers 80 is reversed. As shown in FIG. 6a, one or more intermediate layers 80 are disposed on a substrate 100. A mask 90 is disposed on top of the intermediate layers 80. The mask 90 has opaque areas 91 to partially block a light beam 100 in a backside exposure process (FIG. 6d). A layer of photoresist 82, such as a positive-type photoresist material, is provided on top of the optional layers 80, as shown in FIG. 6c. A backside exposure using a light beam 110 is carried out as shown in FIG. 6d. As part of the light beam is allowed to transmit through the intermediate layers 80 and the non-blocking areas on the mask 90, it interacts with part of the photoresist layer. After the partially exposed photoresist layer is developed, the exposed part is removed and the remaining photoresist layer has a plurality of discrete bumps or rod-like objects 60, as shown in FIG. 6e. The rod-like objects are softened so that they join each other to form a single layer 70, as shown in FIG. 6f. Depending on the photoresist material, the rod-like objects 60 can be softened in a heat treatment process or a UV curing process, for example. The surface of the single layer 70 is then coated with a reflective layer 62, as shown in FIG. 6g.

Figure 7:
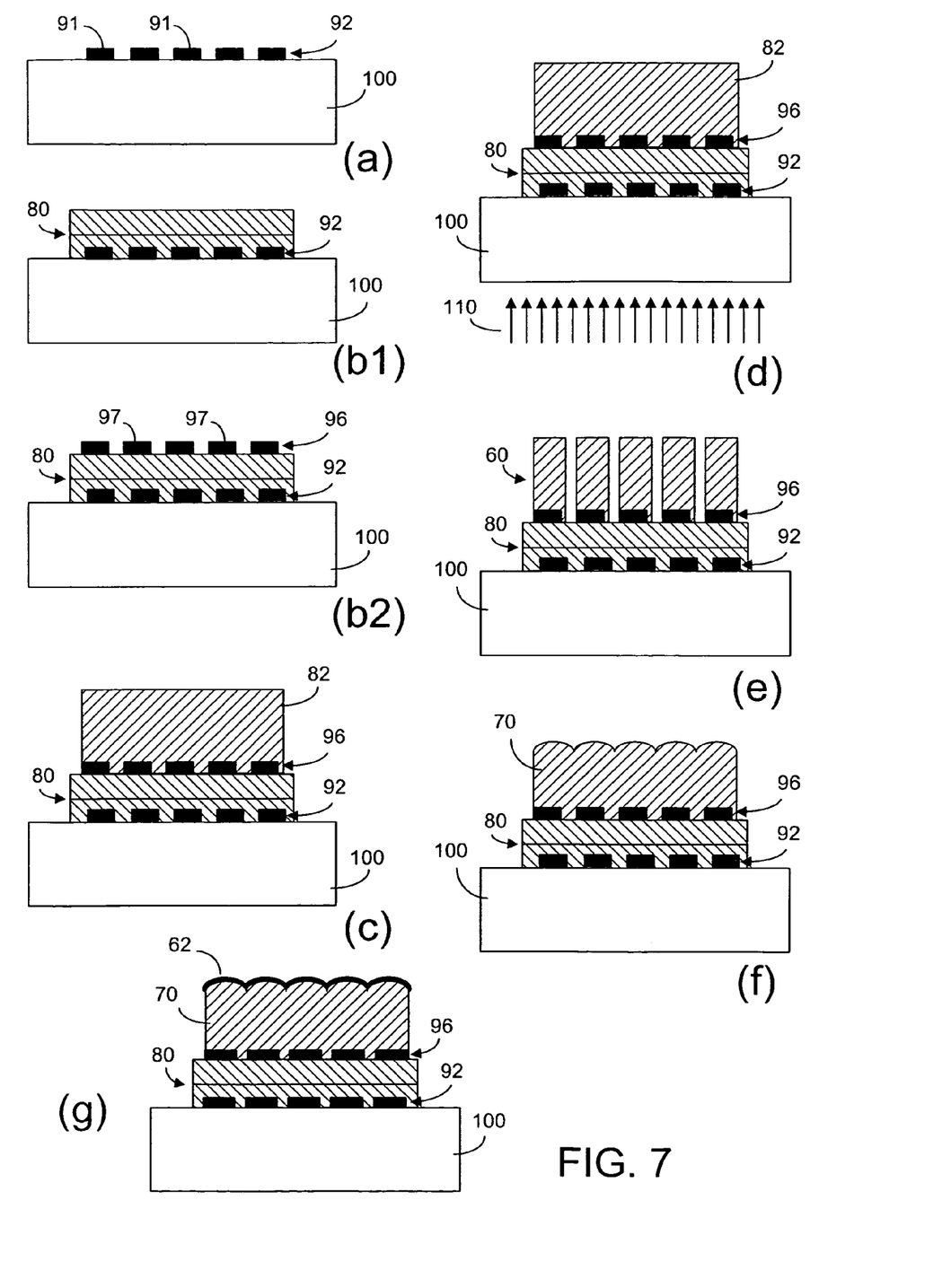
FIGS. 7a to 7g illustrate the steps in making the reflective layer on a substrate, according to a different embodiment of the present invention.

In a different embodiment, two masks are used in the photoresist exposure process as shown in FIGS. 7a to 7g. As shown in FIG. 7a, a mask 92 is produced on a substrate 100. The mask 92 has opaque areas 93 to partially block a light beam 100 in a backside exposure process (FIG. 7d). In an optional step, one or more intermediate layers 80 are disposed on top of the mask 92, as shown in FIG. 7b1. In an additional step, a second mask 96 is disposed on top of the optional intermediate layers 80, as shown in FIG. 7b2. The mask 96 also has opaque areas 97 to partially block the light beam 110. A layer of photoresist 82, such as a positive-type photoresist material, is provided on top of the second mask, as shown in FIG. 7c. The opaque areas 97 areas and the opaque areas 93 have some non-overlapping sections, but they still have non-blocking areas to allow part of the light beam 110 to reach the photoresist layer. A backside exposure using a light beam 110 is carried out as shown in FIG. 7d. As part of the light beam is allowed to transmit through both the masks 92 and 96, it interacts with part of the photoresist layer. After the partially exposed photoresist layer is developed, the exposed part is removed and the remaining photoresist layer has a plurality of discrete bumps or rod-like objects 60, as shown in FIG. 7e. The rod-like objects are softened so that they join each other to form a single layer 70, as shown in FIG. 7f. Depending on the photoresist material, the rod-like objects 60 can be softened in a heat treatment process or a UV curing process, for example. The surface of the single layer 70 is then coated with a reflective layer 62, as shown in FIG. 7g.

Figure 8:
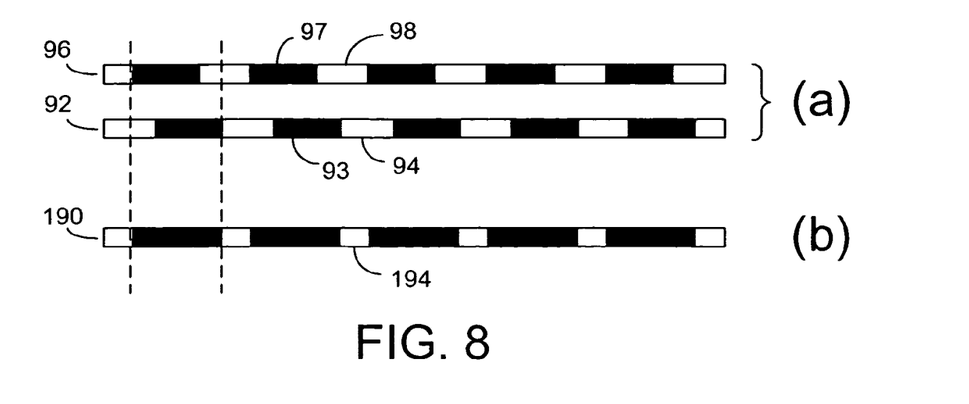
FIGS. 8a and 8b illustrate the result of using two masks in producing the reflective layer.

As mentioned above, the opaque areas 97 areas on the mask 92 and the opaque areas 93 on the mask 92 have some non-overlapping sections, but they still have non-blocking areas to allow part of the backside exposure light beam to transmit through the masks. As shown in FIG. 8a, the mask 92 has opaque or light-blocking areas 93 and non-blocking areas 94. Likewise, the mask 96 has opaque or light-blocking areas 97 and non-blocking areas 98. The masks 92 and 96 are designed and arranged such that the non-blocking areas 94 and the non-blocking areas 96 have overlapping areas so as to allow part of the light beam 110 to transmit through the masks. As such, the masks 92 and 96, together, act like a composite mask 190 having non-blocking areas 194. The non-blocking areas 194 are smaller than either the non-blocking areas 94 or the non-blocking areas 98.

Figure 9:
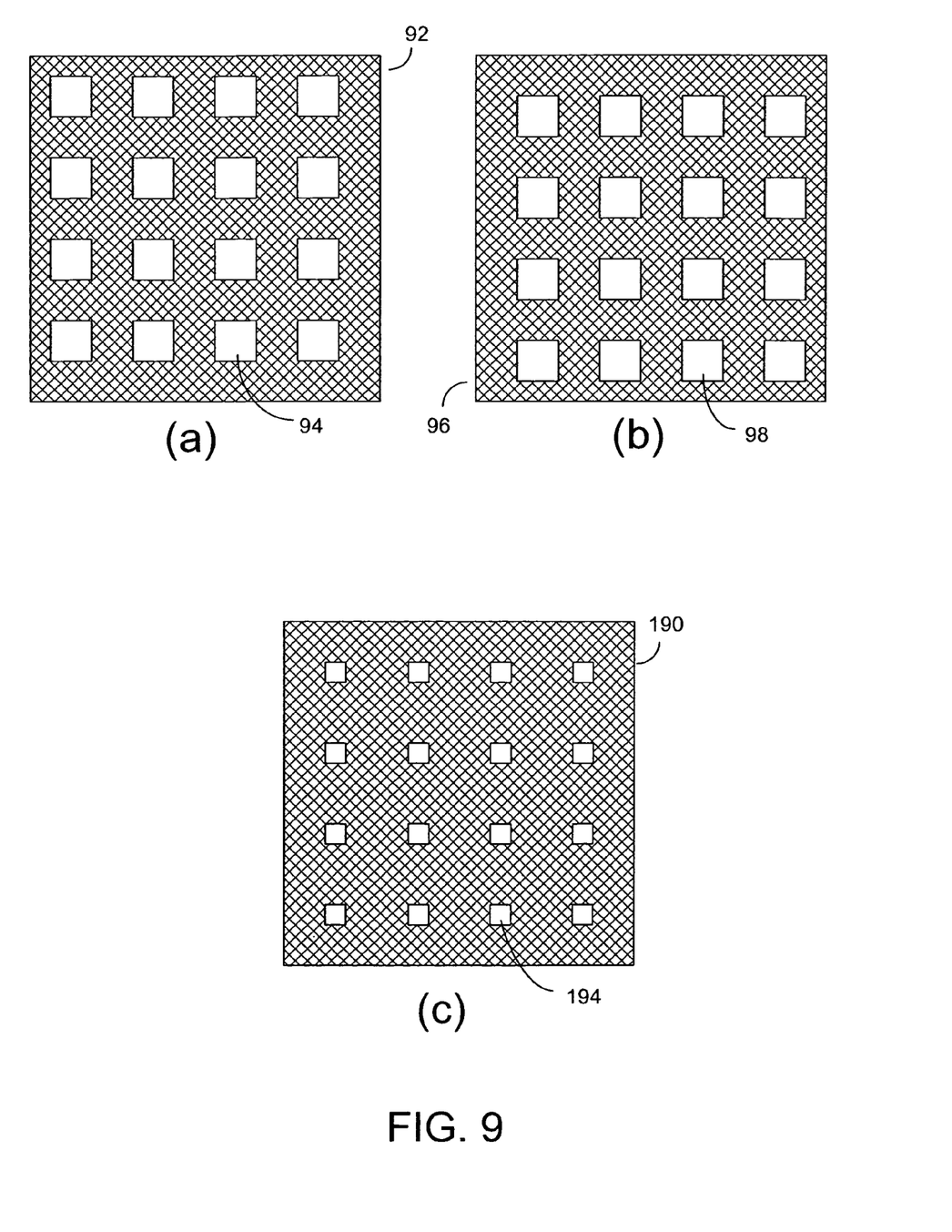
FIGS. 9a to 9c show an example of dual masks for making the reflective layer.

FIGS. 9a to 9c show an example of using two shifted mask patterns to produce a composite mask having reduced non-blocking areas. As shown in FIGS. 9a and 9b, the masks 92 and 96 are similar except that the non-blocking areas are slightly shifted from one mask to another. When the masks 92 and 96 are used together for partially blocking the back-side exposure light beam, the resulting non-blocking areas 194 are reduced, as shown in the composite mask 190 in FIG. 9c.

Figure 10:
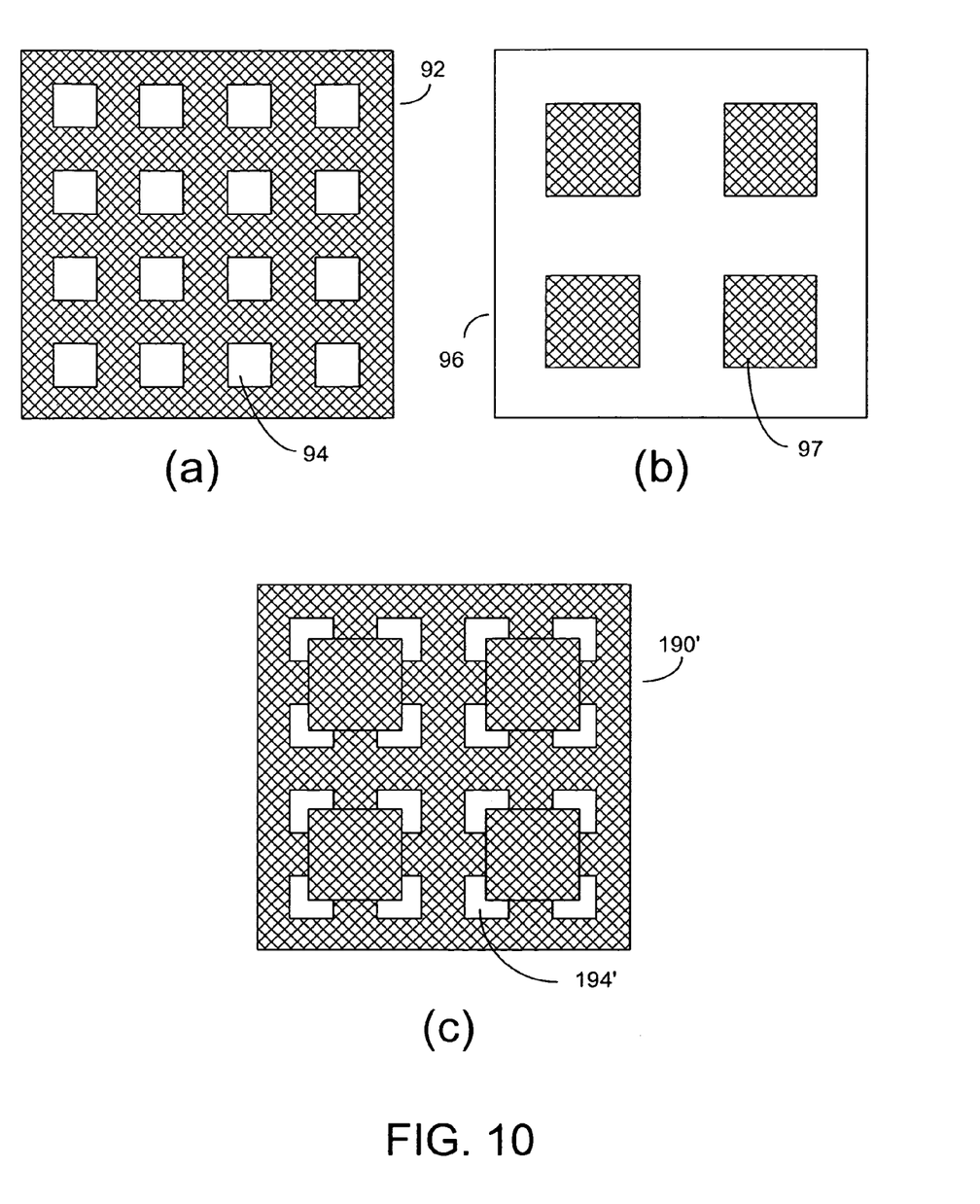
FIGS. 10a to 10c show another example of dual masks for making the reflective layer.

FIGS. 10a to 10c show another example of using two masks to reduce the non-blocking areas. As shown in FIGS. 10a and 10b, the mask 92 and the mask 96 have different mask patterns. When the mask 92 and mask 96 are used together for partially blocking the backside exposure light beam, the blocking areas 97 on the mask 96 overlap with the non-blocking areas 94 on the mask 92. As such, the resulting non-blocking areas 194' are reduced, as shown in the composite mask 190' in FIG. 10c.

Figure 11:
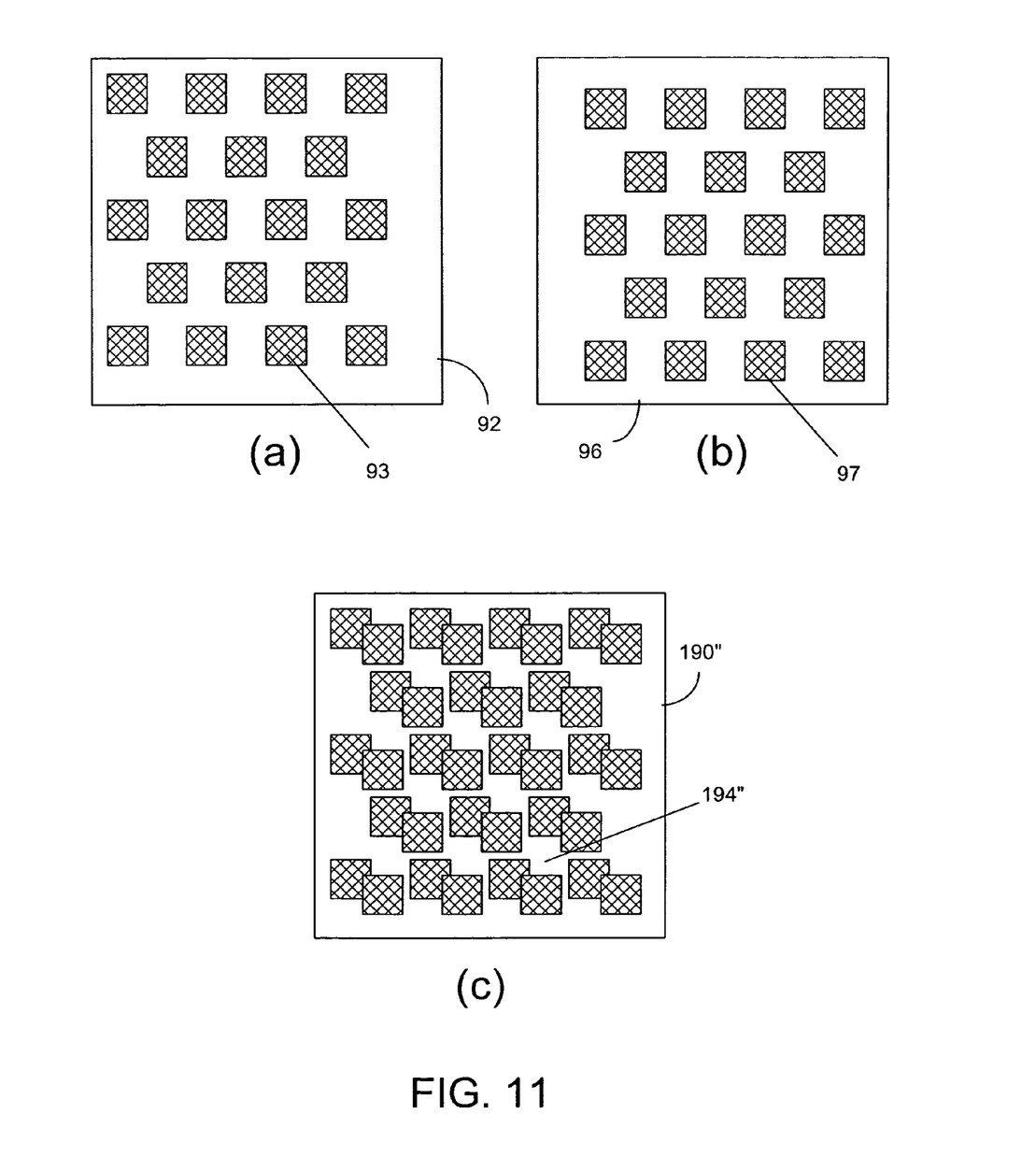
FIGS. 11a to 11c show yet another example of dual masks for making the reflective layer.

FIGS. 11a to 11c show yet another example of using two masks to make the basis of the reflective layer. As shown in FIG. 11a and FIG. 11b, the masks 92 and the mask 96 are similar except that the light-blocking patterns 93 and 97 are slightly shifted from one mask to another. When the masks 92 and 96 are used together for partially blocking the back-side exposure light beam, the resulting non-blocking areas 194" are reduced to crevices and holes, as shown in the composite mask 190" in FIG. 11c.

Figure 12:
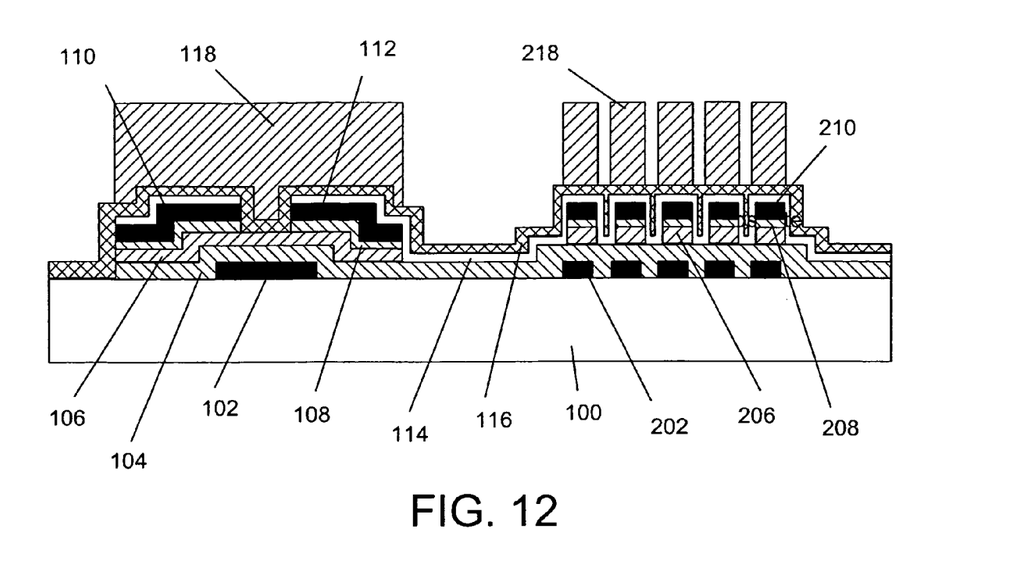
FIG. 12 illustrates an example of using the various layers in a typical LCD panel for producing the basis of the reflective layer, according to the present invention.
Figure 13:
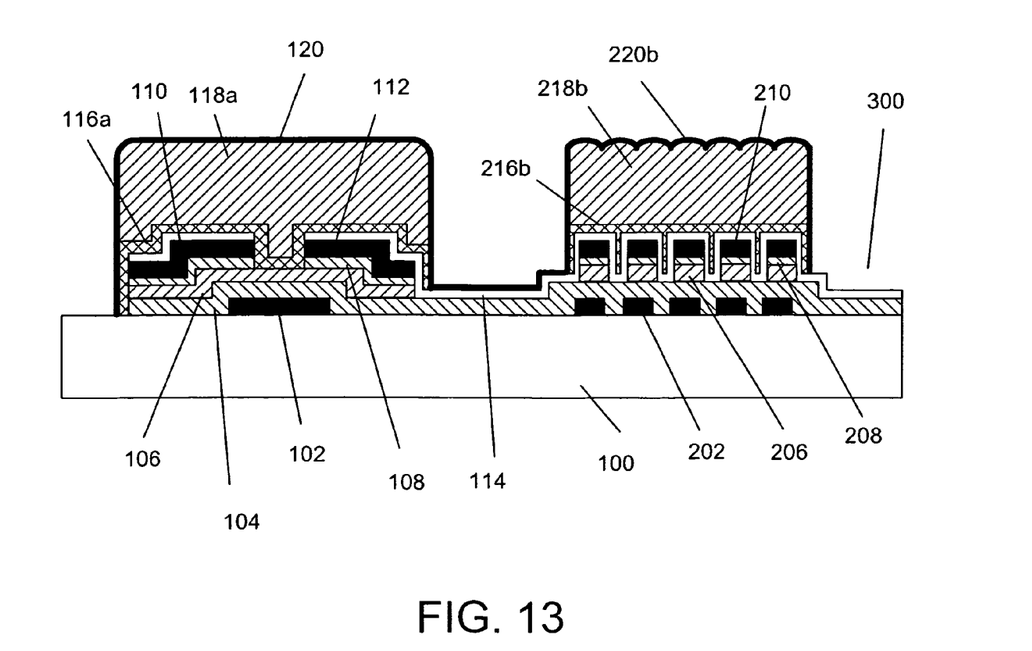
FIG. 13 shows a reflective coating deposited for producing the reflective layer, according to the present invention.

In the fabrication of an LCD panel, many of the layers on the rear substrate can serve as the masks 90, 92, 96 and the intermediate layers 80 for making the reflective layer, according to the present invention. FIG. 12 shows an example of using the generally available layers disposed on the substrate 100 as the masks and the intermediate layers in a transflective LCD panel. As shown in FIG. 12, the metal layer for producing the gate line 102, reflective pattern 202 and common electrode (not shown) can also be used to provide the mask 92 of FIG. 7. The dielectric layer 104, the amorphous silicon (a-Si) layer 106, 206 and the doped amorphous silicon (N+ a-Si) layer 108, 208 can also be used to provide the intermediate layers 80. The source-drain metal layer 110, 112, 210 can be also used to provide the mask 96. As shown in FIG. 12, an indium Tin oxide (ITO) layer 114 and a passivation layer 116 made of silicon oxide or silicon nitride may also present in the various layers disposed on the rear substrate 100. Because these layers are substantially transparent, they do not significantly affect the partial exposure of the photoresist layer to the backside exposure light beam. Thus, after the photoresist layer is exposed through the metal layer 102, 110, 112, 202, 210 and developed, the remaining photoresist layer 118, 218 has a number of discrete portions, substantially aligned to the underlying metal layer 102, 110, 112, 202, 210. After being softened and reshaped by a heat treating process or a UV process, the width of the remaining photoresist portions 118a, 218b would increase. In the process of making a transflective type liquid crystal panel (see FIGS. 3a and 3b), the reshaped photoresist layer 118a, 218b can be used as a mask for etching away part of the passivation layer 116 to leave the remaining passivation portions 116a, 216b in order to expose part of the ITO layer in transmission area 300. FIG. 13 shows a reflective coating, such as Al and Ag, deposited and patterned on the reshaped photoresist 118a, 218b to form a reflective layer 120 in the reflection area (including a portion of the reflective layer 220b in the bump reflection area) of a transflective LCD panel. The exposed ITO area can be used as part of the transmission area 300 in a transflective LCD panel.

It should be noted that the present invention has been disclosed as using one or two masks for masking the photoresist layer in the back-side exposure process. Additional masks can also be used. Furthermore, the exposed and developed photoresist layer is softened by a heat treating process or a UV curing process for reshaping the surface. A different process may also be used to reshape the surface.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A light reflecting structure in a liquid crystal display having a substrate, said structure comprising:
    a first mask disposed on the substrate, the first mask having first light-blocking areas and first non-light blocking areas;
    one or more intermediate layers disposed on the first mask, said one or more intermediate layers made of one or more materials different from the first mask;
    a second mask disposed on the intermediate layers, wherein the second mask has second light blocking areas and second non-light blocking areas, the second light blocking areas at least partially different from the first light-blocking areas;
    a photoresist layer disposed on the second mask, the photoresist layer made of at least one material different from the second mask, the photoresist layer comprising a first surface and an opposing second surface facing the second mask, wherein the first surface comprises uneven areas substantially corresponding to the first light-blocking areas and the second light-blocking areas, the uneven areas forming a continuous uneven surface on said at least one material, the continuous uneven surface substantially corresponding to an entirety of the first light-blocking areas and the second light blocking area; and
    a reflective layer disposed on the photoresist layer.

2. The light reflecting structure according to claim 1, wherein each of the first mask and the second mask is made of a metal layer.

3. The light reflecting structure according to claim 1, wherein said one or more intermediate layers comprise a dielectric layer.

4. The light reflecting structure according to claim 1, wherein said one or more intermediate layers comprise an amorphous silicon layer.

5. The light reflecting structure according to claim 1, further comprising:
   a passivation layer disposed between the first mask and the substrate.

6. A liquid crystal display panel comprising:
   a first substrate,
   a second substrate,
   a liquid crystal layer disposed between the first and second substrates, and
   a light reflecting structure, the light reflecting structure comprising:
   a first mask disposed on the second substrate, the first mask having first light-blocking areas and first non-light blocking areas;
   one or more intermediate layers disposed on the first mask, said one or more intermediate layers made of one or more materials different from the first mask;
   a second mask disposed on the intermediate layers, the second mask having second light blocking areas and second non-light blocking areas, the second light blocking areas at least partially different from the first light-blocking areas;
   a photoresist layer disposed on the second mask, the photoresist layer made of at least one material different from the second mask, the photoresist layer comprising a first surface and an opposing second surface facing the second mask, wherein the first surface comprises uneven areas substantially corresponding to the first light-blocking areas and the second light-blocking areas, the uneven areas forming on said at least one material, the uneven areas forming a continuous uneven surface on said at least one material, the continuous uneven surface substantially corresponding to an entirety of the first light-blocking areas and the second light blocking area; and
   a reflective layer disposed on the photoresist layer.

7. The liquid crystal display panel according to claim 6, comprising a reflective liquid crystal display panel.

8. The liquid crystal display panel according to claim 6, comprising a transflective liquid crystal display panel.

9. The liquid crystal display panel according to claim 6, wherein the reflective layer is made of an electrically conductive material, the light reflecting structure further comprising:
   a switching element disposed on the second substrate, the switching element electrically connected to the reflective layer.

10. The liquid crystal display panel according to claim 6, wherein the reflective layer comprises a first electrically conductive layer, the light reflecting structure further comprises:
    a second electrically conducting layer disposed between the second mask and the photoresist layer, wherein the reflective layer is electrically connected to the second electrically conductive layer;
    a passivation layer disposed between the second electrically conductive layer and the second mask; and
    a switching element disposed on the second substrate, the switching element electrically connected to the reflective layer.

11. The liquid crystal display panel according to claim 6, wherein the photoresist layer is made of at least one photoresist material.

12. The light reflecting structure according to claim 1, wherein the photoresist layer is made of at least one photoresist material.

13. The light reflecting structure according to claim 1, further comprising:
    one or more different layers disposed between the second mask and the photoresist layer, said one or more different layers made of one or more materials different from the photoresist layer and the second mask.

14. The light reflecting structure according to claim 13, wherein said one or more different layers comprise an electrically conductive layer and a passivation layer between the electrically conductive layer and the second mask.

15. The light reflecting structure according to claim 1, wherein said one or more intermediate layers comprise a substantially planar surface adjacent to the second mask.

16. The light reflecting structure according to claim 1, wherein the uneven surface is substantially periodic.

* * * * *